United States Patent
Joshi

(10) Patent No.: US 8,823,429 B1
(45) Date of Patent: Sep. 2, 2014

(54) DATA TRANSITION DENSITY NORMALIZATION FOR HALF RATE CDRS WITH BANG-BANG PHASE DETECTORS

(71) Applicant: STMicroelectronics International N.V., Amsterdam (NL)

(72) Inventor: Archit Joshi, Noida (IN)

(73) Assignee: STMicroelectronics International N.V., Amsterdam (NL)

(*) Notice: Subject to any disclaimer, the term of this patent is extended or adjusted under 35 U.S.C. 154(b) by 0 days.

(21) Appl. No.: 14/084,504

(22) Filed: Nov. 19, 2013

(51) Int. Cl.
*H03L 7/06* (2006.01)

(52) U.S. Cl.
USPC .......................................... 327/148; 327/157

(58) Field of Classification Search
None
See application file for complete search history.

(56) References Cited

U.S. PATENT DOCUMENTS

| | | | | |
|---|---|---|---|---|
| 7,057,429 B2 * | 6/2006 | Kim | ............................... | 327/149 |
| 8,442,178 B2 * | 5/2013 | Kim et al. | ...................... | 375/375 |
| 8,664,988 B1 * | 3/2014 | Xiu | ............................... | 327/156 |
| 2003/0198311 A1 * | 10/2003 | Song et al. | ..................... | 375/376 |
| 2005/0285643 A1 * | 12/2005 | Lee | ............................... | 327/158 |
| 2006/0018417 A1 * | 1/2006 | Jeong et al. | ................... | 375/375 |
| 2006/0078079 A1 * | 4/2006 | Lu | .................................. | 375/376 |
| 2007/0126484 A1 * | 6/2007 | Lin et al. | ....................... | 327/156 |
| 2013/0162312 A1 * | 6/2013 | Jung et al. | ..................... | 327/158 |

OTHER PUBLICATIONS

Ramezani et al., "An Improved Bang-Bang Phase Detector for Clock and Data Recovery Applications," Power Point Presentation, IEEE International Symposium on Circuits and Systems, May 6-9, 2001, Sydney, Australia, 19 pages.
Razavi, "Challenges in the Design of High-Speed Clock and Data Recovery Circuits," *IEEE Communications Magazine*, pp. 94-101, Aug. 2002.
Yan et al., "A 1.25GBB Half-Rate Clock and Data Recovery Circuit," Department of Electrical Engineering, National Chung-Hsing University, Taiwan, 116-119, *IEEE*, 2005.
Tontisirin et al., Gb/s CMOS 1-4th-Rate CDR with Frequency Detector and Skew Calibration, Institute of Microelectronics, Kaiserslauten, Germany, pp. 1-4, IEEE, 2006.
Oh, et al., "A Study on Full Digital Clock Data Recovery (CDR)" Graduate School of Science and Engineering, Tokyo Institute of Technology, 30 Pages, May 26, 2006.

* cited by examiner

*Primary Examiner* — Adam Houston
(74) *Attorney, Agent, or Firm* — Seed IP Law Group PLLC

(57) ABSTRACT

A clock and data recovery circuit includes a phase detector circuit, a charge pump circuit, and a voltage controlled oscillator. The phase detector circuit receives a data signal from an external device and a clock signal from the voltage controlled oscillator and generates a first and a second phase difference signal. The charge pump circuit includes an OR gate receiving on its inputs the first and the second phase difference signals and configured to generate a current if the first and/or second phase difference signal is high.

21 Claims, 11 Drawing Sheets

US 8,823,429 B1

DATA TRANSITION DENSITY NORMALIZATION FOR HALF RATE CDRS WITH BANG-BANG PHASE DETECTORS

BACKGROUND

Technical Field

The present disclosure relates to the field of clock and data recovery circuits. The present disclosure relates more particularly to the field of bang-bang phase detectors for half rate clock and data recovery circuits.

BRIEF SUMMARY

One embodiment is a clock and data recovery circuit for recovering data transmitted from an external electronic device and the clock signal with which it was synchronized. The clock and data recovery circuit includes a phase detector, a charge pump, and a voltage controlled oscillator. The voltage controlled oscillator generates a clock signal that is supplied to the phase detector along with input data from the external electronic device. The phase detector generates phase difference signals UP1, UP2, DN1, DN2 based on the clock signal and the input data. The charge pump circuit that receives UP1, UP2, DN1, DN2 from the phase detector. The clock and data recovery circuit includes an OR gate that receives on its inputs phase difference signals UP1, UP2. The OR gate passes a first current if UP1 and/or UP2 is high. The charge pump circuit outputs an output signal when the OR gate passes the first current. The voltage controlled oscillator receives the output signal and adjusts the frequency of the clock signal based on the output signal.

DETAILED DESCRIPTION

Figure 1:
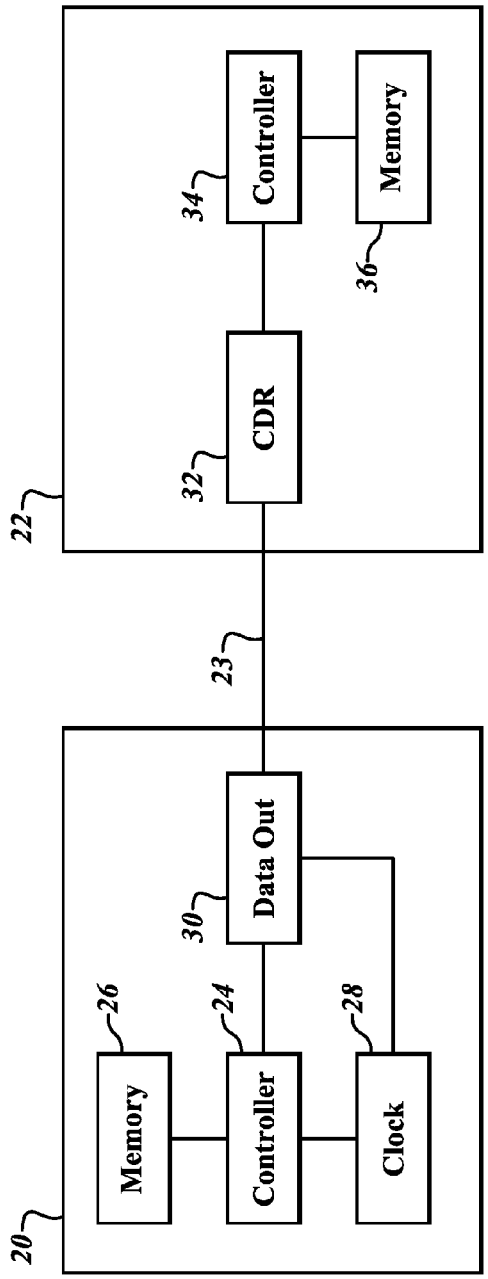
FIG. 1A is a block diagram of two electronic devices connected by a data transfer link according to one embodiment.
FIG. 1B is a timing diagram of a clock signal and a data signal according to one embodiment.

FIG. 1A is a block diagram of a first electronic device 20 and a second electronic device 22 linked by a data transmission line 23 according to one embodiment. The first electronic device 20 includes a controller 24, a memory 26, a clock 28, and a data output circuit 30, each coupled to the controller 24. The second electronic device 22 includes a clock and data recovery circuit 32, a controller 34 coupled to the clock and data recovery circuit 32, and a memory 36 coupled to the controller 34. The data transmission link 23 couples the data output circuit 30 to the clock and data recovery circuit 32.

It is common for a person to transfer data from a first electronic device 20 to a second electronic device 22. Typically this involves copying data from the memory 26 of the first electronic device 20 to the memory 36 of the second electronic device 22. In order to transfer the data, the controller 24 reads data out of the memory 26 and outputs it to the data output circuit 30. The data output circuit 30 transmits the data on the data transmission link 23. The transitions between high and low states in the data signal transmitted on the transmission link 23, which represent the data being transferred, are timed in phase with the clock signal generated by the clock 28. However, the clock signal itself is not transmitted on the data transmission link 23. This can make it difficult for the receiving device 22 to accurately extract the data from the data signal.

In order to accurately extract the data from the data signal, the second electronic device 22 includes a clock and data recovery circuit 32. The clock and data recovery circuit 32 extracts the data from the data signal by generating a clock signal corresponding to the clock signal from the clock 28 based on transitions in the data signal. The clock and data recovery circuit recovers the clock signal and is then able to extract the data 32 and output it to the controller 34. The controller 34 can store the data in the memory 36 or process it in some other manner.

FIG. 1B is a timing diagram which illustrates the clock signal generated by the clock 28 and the data signal output from the data output circuit 30 on the data transmission link 23. As can be seen, the clock signal is a periodic signal that switches between high and low states with a fixed frequency. The data signal includes transitions between high and low states which represent the data being transferred. The transitions in the data signal occur on the leading and falling edges of the clock signal. In this way the transitions in the data signal are synchronized with the clock signal generated by the clock 28.

Figure 2:
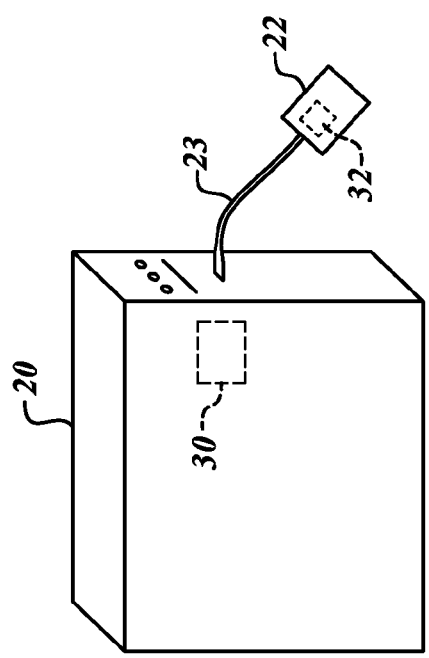
FIG. 2 is an illustration of two electronic devices according to one embodiment.

FIG. 2 is an illustration of the first electronic device 20 and the second electronic device 22 coupled together by a data transmission line 23 according to one embodiment. In the embodiment illustrated in FIG. 2, the electronic device 20 is a common desktop computer tower commonly used by people in their homes and places of business. The second electronic device 22 is an external solid-state memory drive. The second electronic device 22 includes a data output circuit 30 which outputs data from a magnetic hard drive. The data output circuit 30 is shown in dashed lines. As described previously, the data output circuit 30 is coupled to a clock 28, memory 26, and controller 24, though these are not shown in FIG. 2. The solid-state drive 22 includes a clock and data recovery circuit 32 for recovering the clock and data signals transmitted by the output circuit 30 as described previously. The desktop computer 20 and the solid-state Drive 22 are coupled together by a data transmission link 23 which is a data transmission link by which data is transferred from the desktop computer 22 to the solid-state Drive 22.

Figure 3:
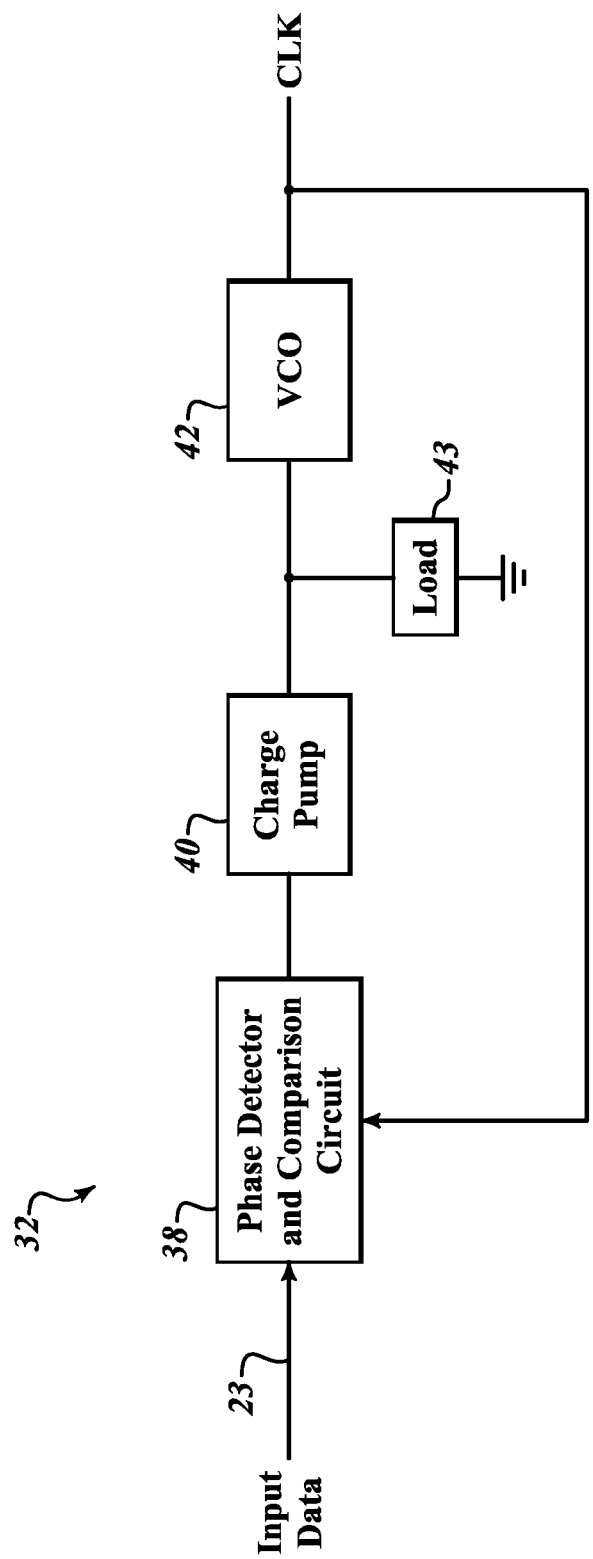
FIG. 3 is a block diagram of a clock and data recovery circuit according to one embodiment.

FIG. 3 is a block diagram of the clock and data recovery circuit 32 according to one embodiment. The clock and data recovery circuit 32 includes a phase detector and comparison circuit 38 coupled to the data transmission line 23. A charge pump 40 is coupled to the phase detector 38. A voltage controlled oscillator 42 is coupled to the charge pump 40. A load 43 is coupled between the charge pump 40 and the voltage controlled oscillator 42.

The phase detector 38, charge pump 40, and voltage controlled oscillator 42 form a phase locked loop. In particular, the voltage controlled oscillator 42 generates a clock signal corresponding to the clock signal generated by the clock 28 by which data is transferred onto the data transmission line 23. The voltage controlled oscillator 42 outputs the clock signal to the phase detector 38. The phase detector 38 also receives the input data signal from the data transmission line 23. The phase detector 38 generates a phase difference signal based on a phase difference between the data signal and the clock signal generated by the voltage controlled oscillator 42. The phase difference signal is therefore indicative of an error between the phase of the clock signal generated by the voltage controlled oscillator 42 and the phase of the input data signal which is synchronized with the external clock signal originally generated by the clock 28 of the first electronic device 20. The charge pump 40 receives the phase difference signal from the phase detector 38 and provides an output signal to the voltage controlled oscillator 42. The output signal provided to the voltage controlled oscillator 42 is indicative of an error in the phase of the clock signal. The voltage controlled oscillator receives the output signal from the charge pump 40 and adjusts the phase or frequency of the clock signal based on the output signal. In this manner, the phase locked loop of the clock and data recovery circuit 32 very quickly generates the clock signal which is locked in phase with the original clock signal from the clock 28 by which the input data signal is generated.

In one embodiment, the charge pump 40 outputs the output signal in conjunction with the load 43. Current flows from the charge pump 40 into the load 43, or from the load 43 into the charge pump 40. In one embodiment, the output signal is the voltage across the load 43.

Those of skill in the art will understand that the clock and data recovery circuit may include many other components than those disclosed in FIG. 3. For the sake of brevity such other components have not been described but are known to those of skill in the art.

Figure 4:
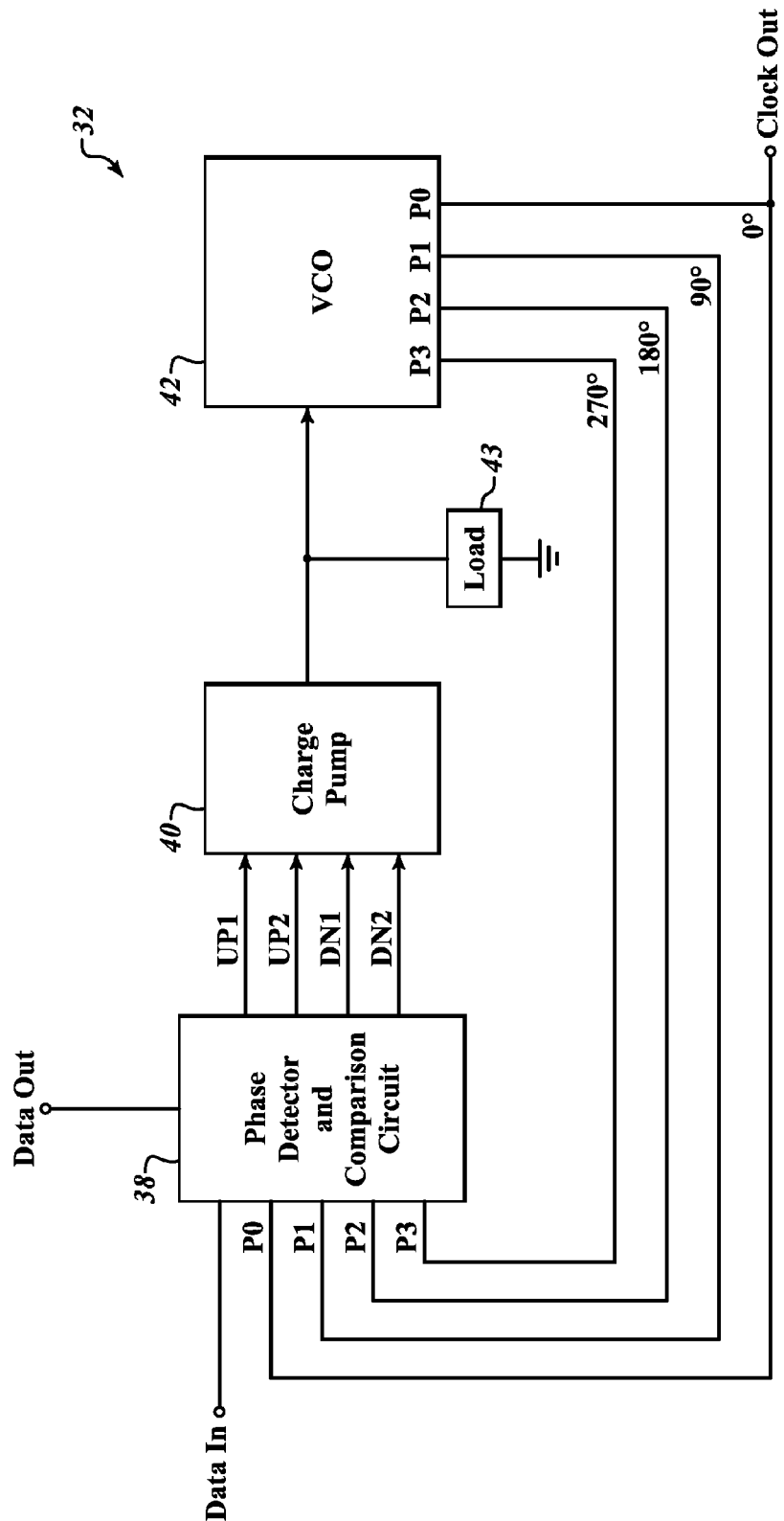
FIG. 4 is a block diagram of a clock and data recovery circuit according to one embodiment.

FIG. 4 is a schematic diagram of a clock and data recovery circuit 32, according to one embodiment. The clock and data recovery circuit 32 includes a phase detector 38, charge pump 40, load 43, and the voltage controlled oscillator 42 as described previously with relation to FIG. 3. The voltage controlled oscillator 42 generates four clock signals P0-P3 which are mutually out of phase with each other. The clock signals P0-P3 are fed to the phase detector 38. The phase detector 38 generates phase difference signals UP1, UP2, DN1, DN2 and supplies them directly to the charge pump 40. The charge pump 40 generates an output signal that is indicative of the phase difference between the clock signal P0 and the input data signal. The voltage controlled oscillator 42 adjusts the frequency of the clock signals P0-P3 based on the output signal received from the charge pump 40. The clock signal P0 corresponds to the recovered clock signal from the clock 28 by which the input data signals generated.

In one embodiment, the phase detector and comparison circuit 38 includes four flip-flops. The flip-flops each receive a respective one of the clock signal P0, P1, P2, P3. The flip-flops each receive the input data signal. The clock signals P0, P1, P2, P3 are generated by the voltage controlled oscillator 42. When the voltage controlled oscillator 42 is locked with the clock signal of the clock 28 of the electronic device 20, the clock signal P0 is locked in phase with the external clock signal of the clock 28 by which the data input signals transmitted. The clock signal P1 is 90° out of phase with the clock signal P0. The clock signal P2 is 180° out of phase with the clock signal P0. The clock signal P3 is 270° out of phase with the clock signal P0.

Each of the flip-flops outputs a signal based on transitions in the input data signal and the respective clock signal P0, P1, P2, or P3. The outputs of the flip flops are supplied to logic gates such as OR gates or XOR gates that each compare the outputs of two flip flops. The outputs of this logic gates are the phase difference signals UP1, UP2, DN1, and DN2 which indicate phase differences between the clock signals and the transitions in the data signals.

While some example architecture for a phase detector 38 has been described above, those of skill the art will understand that there are many ways to generate the phase difference signals UP1, UP2, DN1, and DN2. Any suitable architecture for generating the difference signals UP1, UP2, DN1, and DN2.

As described previously, in one embodiment, the charge pump 40 outputs the output signal in conjunction with the load 43. Current flows from the charge pump 40 into the load 43, or from the load 43 into the charge pump 40. In one embodiment, the output signal is the voltage across the load 43. The load can be a capacitor having one terminal connected to ground and a second terminal connected between the charge pump 40 and the oscillator 43. Charge flows between one plate of the capacitor and the output of the charge pump 40. The voltage across the capacitor changes as charge flows onto or off of the terminal of the capacitor. The frequency of the oscillator changes with the voltage on the capacitor.

Figure 5:
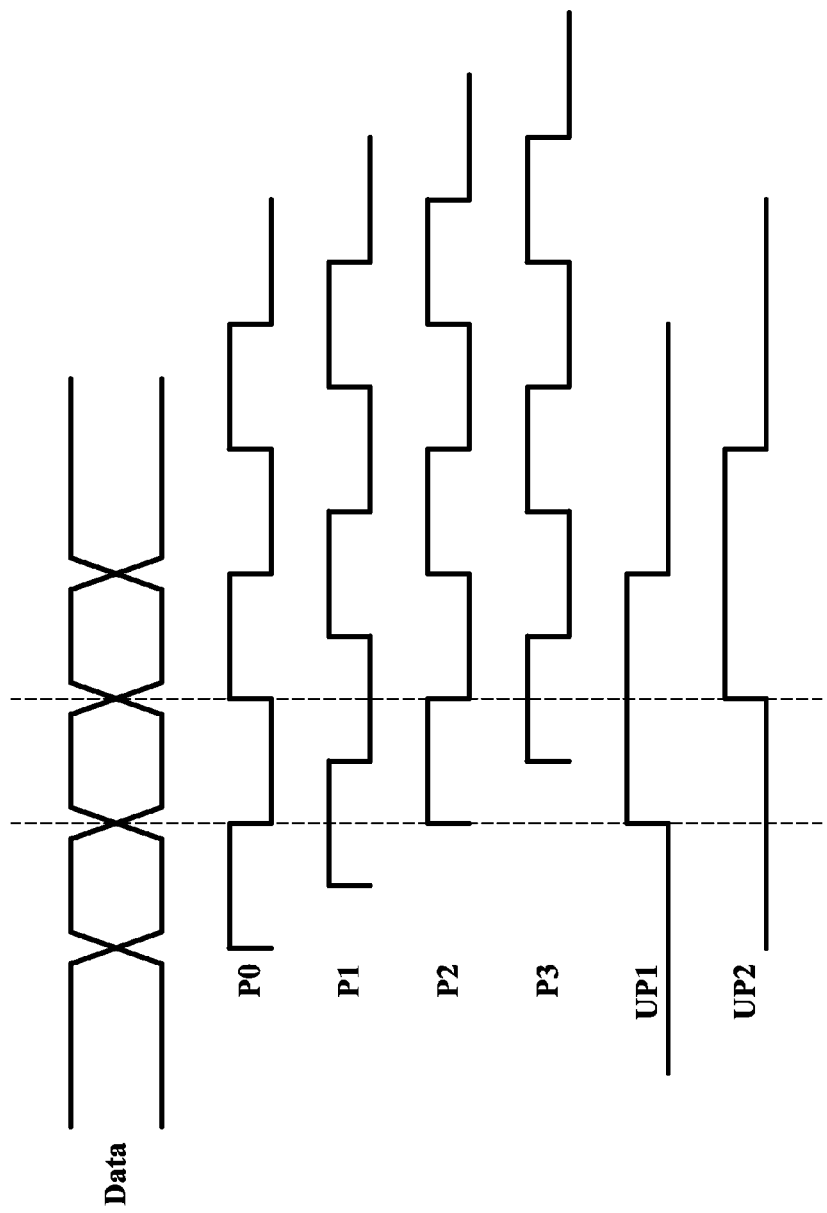
FIG. 5 is a timing diagram of a data signal, clock signals, and phase detection signals according to one embodiment.

FIG. 5 is a timing diagram of the input data signal, the clock signals P0-P3, and two phase difference signals UP1, UP2 according to one embodiment. The clock signals P0-P3 are out of phase with each other as described previously. The phase difference signal UP1 is locked in phase with the clock signal P2. When a transition in the data occurs and the clock signal P2 is high, the phase difference signal UP1 goes high as well. Beneficially, as will be described in more detail below in relation to FIG. 8, the phase difference signal UP1 remains high for a minimum period of a complete clock cycle or two clock cycle transitions (2 UI). The phase difference signal UP2 is locked in phase with the clock signal P0. The phase difference signal UP2 only goes high if a further transition in the data occurs while the phase difference signal UP1 is high.

Figure 6A:
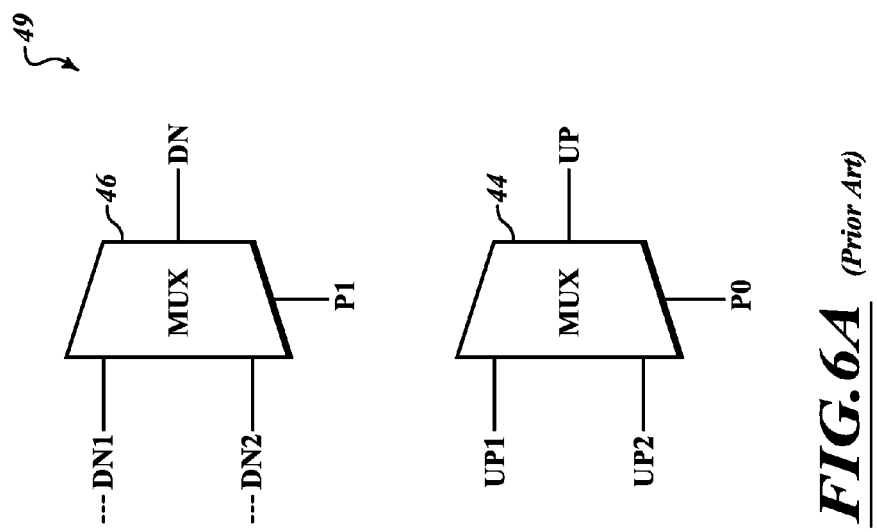
FIG. 6A is a block diagram of a portion of a known phase detector.

FIG. 6A is a schematic diagram of a portion of a known phase detector 49 according to one embodiment. In addition to circuitry used to generate the phase difference signals UP1, UP2, DN1, DN2, which has some similarities with the phase detector 38 of FIG. 4, the known phase detector 49 includes two multiplexers 44, 46. The multiplexer 44 receives on its inputs phase difference signals UP1, UP2 and outputs a phase difference signal UP. The multiplexer 44 is timed according to the clock signal P0. The multiplexer 46 receives on its inputs the phase difference signals DN1, DN2 and outputs a phase difference signal DN. The multiplexer 46 is timed according to the clock signal P1.

Figure 6B:
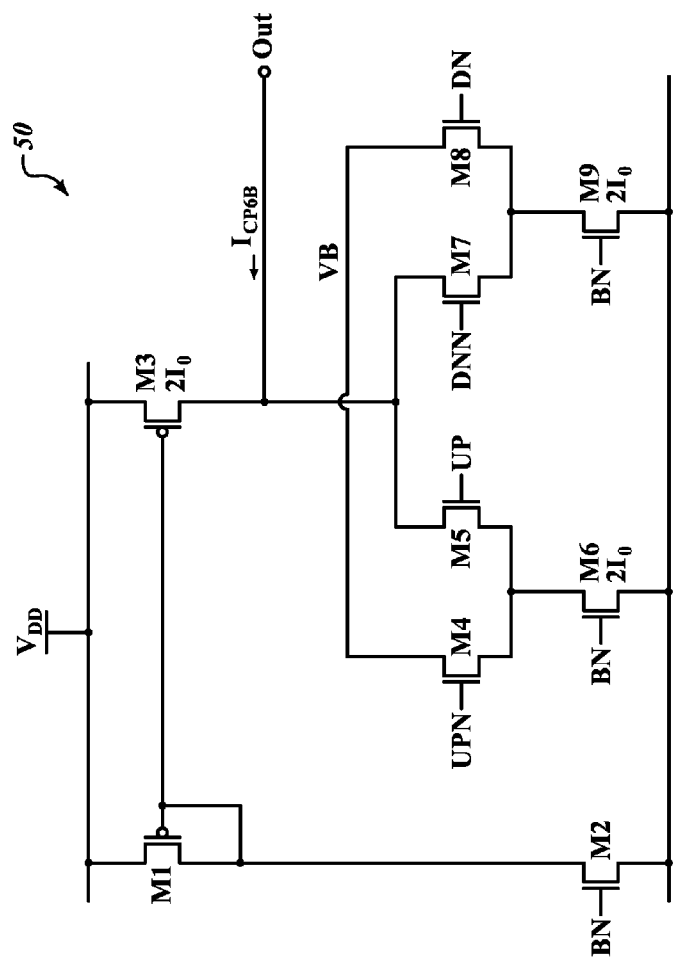
FIG. 6B is a circuit diagram of a known charge pump.

FIG. 6B is a schematic diagram of a known charge pump circuit 50 that receives the phase difference signals UP, DN from the phase detector 49 of FIG. 6A. The charge pump circuit 50 also receives the signals UPN, DNN, which are the complements of the signals UP, DN respectively. The charge pump circuit 50 of FIG. 6B includes a PMOS transistor M1 coupled to an NMOS transistor M2. The transistor M2 receives on the gate terminal a high voltage BN. The source of the transistor M2 is coupled to ground. The current in the transistor M2 is therefore based on the gate voltage BN. The PMOS transistor M1 receives the voltage VDD on its source terminal. The gate of the transistor M1 is coupled to the drain of the transistor M1. The gate voltage on the transistor M1 will be drawn to the voltage that allows it to conduct the full current driven by the transistor M2. The transistor M3 is coupled to the transistor M1 in a current mirror configuration. Transistor M3 will produce a current equal to the current in the transistor M1 if the width to length ratio of the transistor M3 is equal to the width to length ratio of the transistor M1. The current in the transistor M3 will be greater or smaller than the current in the transistor M2 based on the factor by which the width to length ratio of the transistor M3 is greater or smaller than the width to length ratio of the transistor M2. In this case, the transistor M3 drives a current $2I_0$. The charge pump circuit 50 further includes NMOS transistors M4-M9. The transistor M5 receives on its gate the phase difference signal UP. The transistor M7 receives on its gate the phase difference signal DN. The transistors M6, M9 receive on their gate terminals the voltage BN and are each configured to drive a current of $2I_0$.

An output terminal Out is coupled between the transistor M3 and the transistors M5. An output current $I_{CP6B}$ flows into the charge pump circuit 50 and through M5, M6 when the phase difference signal UP is high.

In one embodiment, the output current flows from the terminal of a capacitor in the load 43 coupled to the output terminal Out, not shown in FIG. 6B. The output current therefore adds or removes charge from the terminal of the capacitor, thereby changing the voltage across the terminals of the capacitor. The output current $I_{CP6B}$ is equal to $2I_0$. This changes the voltage on the capacitor to a degree depending on the duration for which the current $2I_0$ flows from the capacitor into the charge pump circuit 50.

The voltage on the capacitor is an output signal that is supplied to a voltage controlled oscillator of the clock and data recovery circuit. The frequency of the clock signal output by the voltage controlled oscillator depends on the voltage on the capacitor. Thus, as the voltage on the capacitor increases or decreases, the frequency of the clock signal generated by the voltage controlled oscillator increases or decreases. The duration for which the current flows from the capacitor into the charge pump circuit 50 corresponds to the phase difference between the clock signal generated by the controlled oscillator and transitions in the data signal.

The phase detector 49 and the charge pump circuit 50 according to FIGS. 6A and 6B suffer from many drawbacks. In particular, the presence of the multiplexers 44, 46 greatly complicates the clock and data recovery circuit and increases power consumption in addition to consuming a larger area in the semiconductor substrate. The presence of the multiplexers 44, 46 also adds to increase jitter in the recovered clock signal. Furthermore, the phase difference signal UP has a minimum pulse width which is half the minimum pulse width of the signals UP1, UP2 generated by the phase detector circuit 38 according to one embodiment. The maximum speed of operation of a clock and data recovery circuit is inhibited by using a smaller pulse width of the UP signal.

Figure 7:
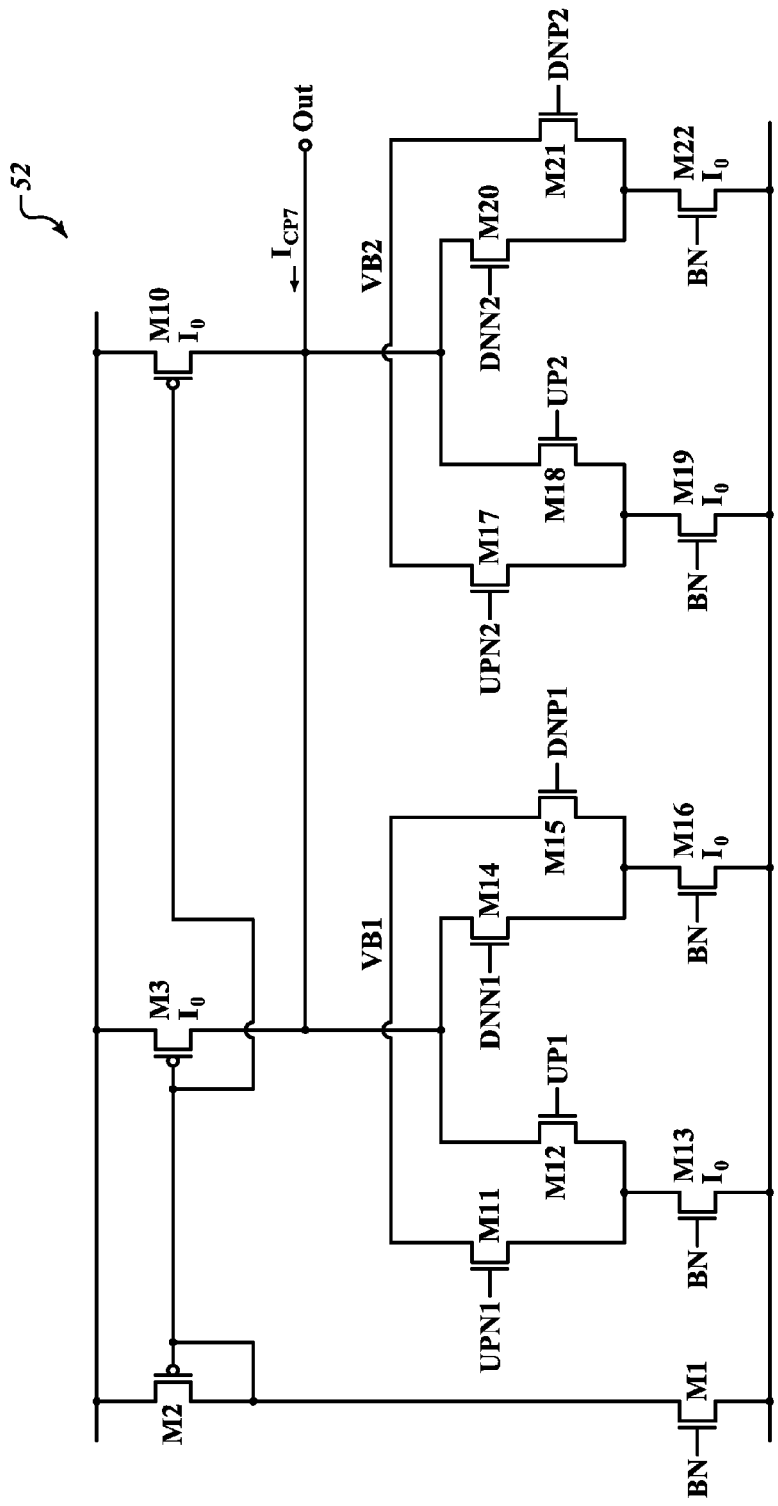
FIG. 7 is a circuit diagram of a known double charge pump.

FIG. 7 is a schematic diagram of another known charge pump circuit 52. The charge pump circuit 52 includes transistors M1, M2, M3 as described previously. However, the transistors M1, M2, M3 are configured so that the transistor M3 generates a current of $I_0$ instead of $2I_0$ as in FIG. 6B. The charge pump circuit 52 further includes a transistor M10 in a current mirror configuration with the transistors M2, M3. The transistor M10 generates a current of $I_0$. Transistors and M12, M14, M18, M20 are in the current paths of the transistors M3, M10. The transistor M12 receives on its gate the phase difference signal UP1. The transistor M14 receives on its gate the complimentary phase difference signal DNN1, which is the compliment of the phase difference signal DN1. The transistor M18 receives on its gate the phase difference signal UP2. The transistor M20 receives on its gate the complimentary phase difference signal DNN2, which is the compliment of the phase difference signal DN2.

As described previously in FIG. 6B, a load 43 is coupled to the output terminal Out of the charge pump 43. In one embodiment the load includes a capacitor coupled to the out terminal Out. When the phase difference signal UP1 is high, a current $I_{CP7}$ equal to $I_0$ flows into the charge pump circuit 52 from the terminal Out. When the phase difference signals UP1, UP2 are both high, the current $I_{CP7}$ is equal to $2I_0$. The duration and the magnitude of the current $I_{CP7}$ is proportional to the phase difference between the clock signal generated by the voltage controlled oscillator and the transitions in the input data signal. The frequency of the clock signal output by the voltage controlled oscillator depends on the voltage on the capacitor. Thus, as the voltage on the capacitor increases or decreases, the frequency of the clock signal generated by the voltage controlled oscillator increases or decreases.

The charge pump circuit 52 of FIG. 7 avoids some of the drawbacks of the charge pump circuit 50 of FIG. 6B, but leads to other drawbacks. The multiplexers 44, 46 of FIG. 6A are not needed because the phase difference signals UP1, UP2, DN1, DN2 are supplied to the charge pump circuit 50 directly. However, the complexity of the charge pump circuit 52 is increased with respect to the charge pump circuit 50. Furthermore, logic circuitry is still needed to normalize the output current signal $I_{CP7}$ due to the fact that it is sometimes higher than $I_0$. Circuitry is also needed to reduce the gain of the phase locked loop in which the charge pump circuit 52 is a part.

Figure 8:
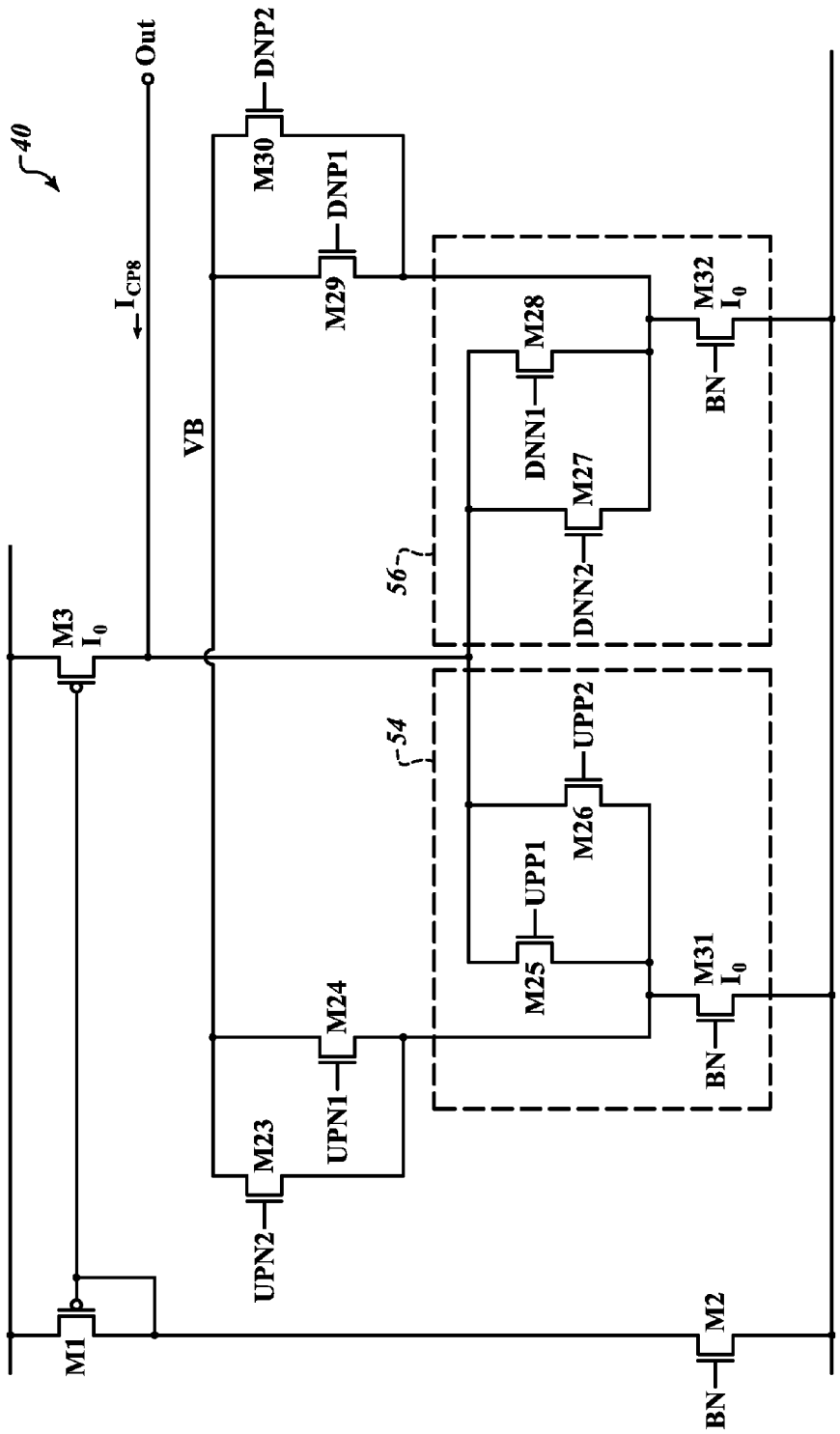
FIG. 8 is a schematic diagram of a charge pump according to one embodiment.

FIG. 8 is a block diagram of the charge pump 40 of FIG. 4 according to one embodiment. The charge pump circuit 40 includes transistors M1, M2, M3 as described previously. The transistor M3 generates a current $I_0$. The charge pump circuit 40 further includes transistors M23-M30. The transistor M25 receives on its gate the phase difference signal UP1. The transistor M26 receives on its gate the phase difference signal up to. The transistor M28 receives on its gate the complementary phase difference signal DNN1, which is the complement of the phase difference signal DN1. The transistor M27 receives on its gate the complementary phase difference signal DNN2 which is the complement of the phase difference signal DN2. An output terminal Out is coupled to the drain of the transistor M3. The output terminal Out passes an output current $I_{CP8}$ into the charge pump circuit 40.

The charge pump circuit 40 of FIG. 8 is significantly simpler than the charge pump circuits 52, 50 of FIG. 7 and FIG. 6B. The transistors M25, M26, M31 comprise an OR gate 54 which has as its inputs the phase difference signals UP1, UP2. The OR gate 54 passes the output current $I_{CP8}$, equal to $I_0$, from the output terminal Out if either of the phase difference signals UP1, UP2 are high. If both are high, the current $I_0$ is still passed from the output terminal Out instead of the current $2I_0$ as in FIG. 7. The presence of the OR gate 54 provides many benefits over the charge pump circuits 52, 50 of FIGS. 7 and 6B In one embodiment, the output terminal Out is coupled to a load 43 not shown in FIG. 8. The load includes a capacitor having a terminal connected to the output terminal Out. A current $I_0$ flows into the charge pump circuit 40 from the terminal of the capacitor if UP1 or UP2 is high. This changes the voltage on the capacitor by an amount dependent on the duration for which the current $I_0$ flows from the capacitor into the charge pump circuit 40. The current $I_{CP8}$ is a phase difference current, the duration of which is indicative of the phase difference between the clock signal P0 and the transitions in the input data signal. The current $I_{CP8}$ is an output signal, though it can flow into or out of the charge pump circuit 40.

In one embodiment the voltage on the capacitor is an output signal that is supplied to a voltage controlled oscillator 42 of the clock and data recovery circuit 32. The frequency of the clock signal output by the voltage controlled oscillator 42 depends on the voltage on the capacitor. Thus, as the voltage on the capacitor increases or decreases, the frequency of the clock signal generated by the voltage controlled oscillator 42 increases or decreases. The voltage on the capacitor increases or decreases in proportion to the charge which is added or removed by the output current $I_{CP8}$. The duration for which the current $I_{CP8}$ flows from the capacitor into the charge pump circuit 50 corresponds to the phase difference between the clock signal generated by the controlled oscillator and the transitions in the data signal.

The presence of the OR gate 54 in the charge pump circuit 40 of FIG. 8 according to one embodiment, has many advantages over the known charge pump circuits 50, 52 of FIGS. 6B and 7. Because the phase difference signals UP1, UP2, DN1, DN2 are fed directly to the charge pump circuit 40, the multiplexers 44, 46 of FIG. 6A are not needed. Likewise, the additional current mirror transistor M10 of FIG. 7 is not needed. Of greater benefit still, is the removal of the normalization circuitry which is needed to normalize the output current which flows into the charge pump circuits 50, 52 due to the fact that the current can be higher than $I_0$ at times. Because the phase difference signals UP1, UP2 have a minimum pulse with that is twice the minimum pulse width of the phase difference signals in FIGS. 6B and 7, the maximum speed of operation of the clock and data recovery circuit 32 is increased. The deterministic jitter of the clock and data recovery circuit 32 improves from 0.6 UIpp to 0.42 UIpp, a tremendous improvement in the bit error rate BER. This logic does not add any loop delay which is very beneficial for the performance of the clock and data recovery circuit. The logic to normalize the phase detector and charge pump gain is eliminated. The gain of the clock and data recovery circuit 32 is reduced.

Though not described in detail, the current $I_{CP8}$ can flow out of the output terminal Out when both OR gates 56 and 54 are off. In this case, the output current $I_{CP8}$ is the current $I_0$ from the transistor M3 and flows onto the terminal of the capacitor or otherwise is provided to the voltage controlled oscillator 42. The voltage controlled oscillator 42 adjusts its frequency accordingly.

The output of the charge pump circuit 40 can be other than a current passed to or form the charge pump circuit 40. Those of skill in the art will understand that many other output signals are possible in light of the present disclosure. All such other embodiments for supplying an output signal to the voltage controlled oscillator fall within the scope of the present disclosure.

Figure 9:
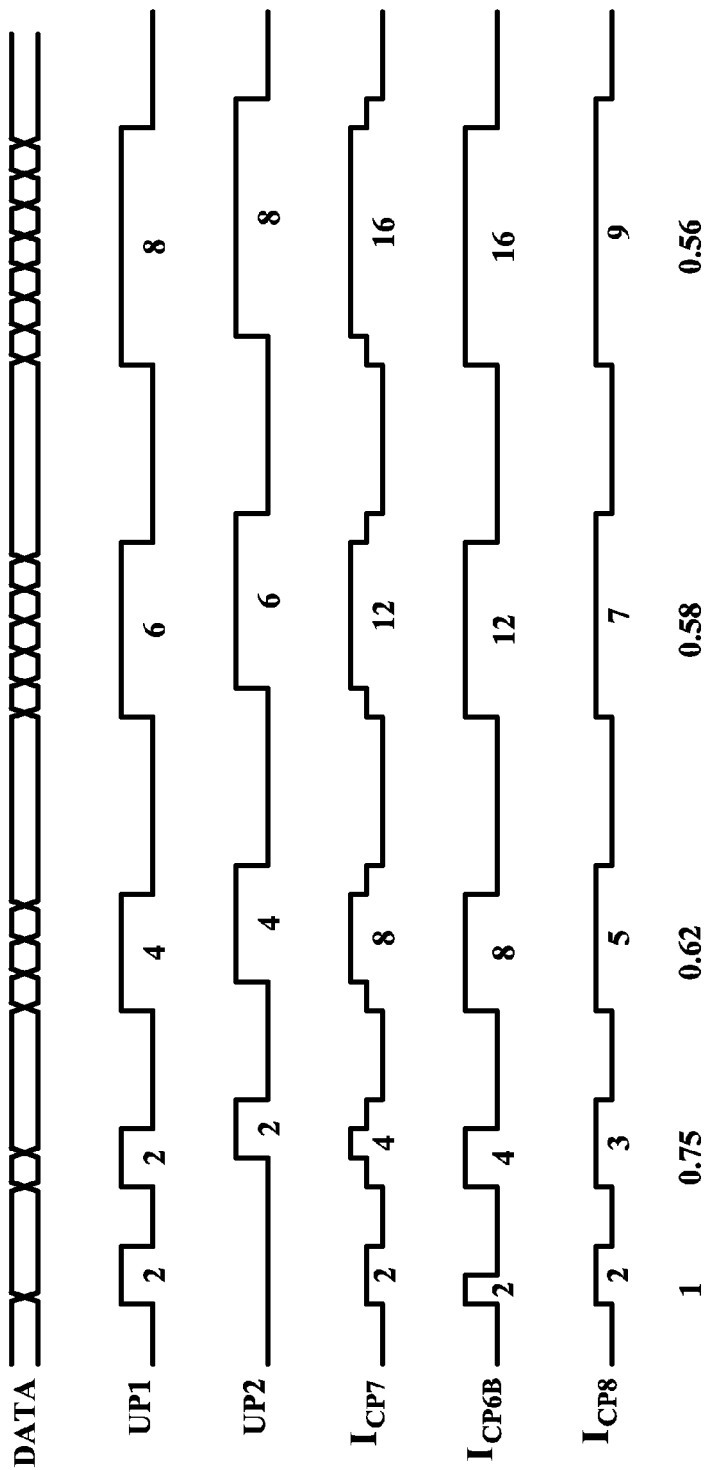
FIG. 9 is a timing diagram of a data signal, phase difference signals, known charge pump outputs, and a charge pump output according to one embodiment.

FIG. 9 is a timing diagram of the input data signal, the phase difference signals UP1, UP2, the known charge pump output currents $I_{CP6B}$, $I_{CP7}$, and the charge pump output $I_{CP8}$ according to one embodiment. When the first transition occurs in the data signal, UP1 goes high for a period of 2 UI. When the second data transition occurs, UP1 one goes high again for a period of 2 UI. Because a third data transition happens while UP1 is high, UP2 goes high on the third transition and stays high for a period of 2 UI. As can be seen, UP2 only goes high if a data transition occurs while UP1 is high. As the data transition density increases, the duration that UP1 is high increases to 4 UI, 6 UI, then 8 UI. UP2 goes high for the same duration, but delayed by 1 UI.

The output current $I_{CP6B}$ of the charge pump circuit 50 goes high to a value of $2I_0$ for a period of 1 UI, then 2 UI, then 4 UI, then 6 UI, then 8 UI. These portions are labeled 2, 4, 8, 12, 16 during these respective periods because the total current is double during these periods. This requires complex normalization logic in order to reduce the gain of the clock and data recovery circuit as described previously.

The output current $I_{CP7}$ of the charge pump circuit 52 goes high to a value of $I_0$ while only one of UP1, UP2 is high, and to a value of $2I_0$ when both UP1 and UP2 are high. The periods for which $I_{CP7}$ is high are labeled 2, 4, 8, 12, 16 denoting the total current that has flowed during the periods. This requires complex normalization logic in order to reduce the gain of the clock and data recovery circuit as described previously.

The output $I_{CP8}$ of the charge pump circuit 40 according to one embodiment only goes high to a value of $I_0$. $I_{CP8}$ is high whenever either UP1 or UP2 is high due to the presence of the OR gate 54 in the charge pump circuit 40 of FIG. 8. The total current that flows during these periods is reduced with respect to $I_{CP7}$ and $I_{CP6B}$. The complex normalization logic is not needed to reduce the gain of the clock and data recovery circuit 32 according to one embodiment. As the data transition density increases, the ratio of the total current that flows during the pulse periods for $I_{CP8}$ versus $I_{CP7}$ and $I_{CP6B}$ decreases. These ratios are listed below the total current numbers of $I_{CP8}$. For the lowest data transition density the ratio is 1. For the next highest data transition density the ratio is 0.75. The ratio reduces to 0.56 for the highest data transition density shown on the far right of FIG. 9. Thus, the gain for the clock and data recovery circuit 32 according to one embodiment is lower than the loop gain for the known charge pump circuits 50, 52.

Figure 10:
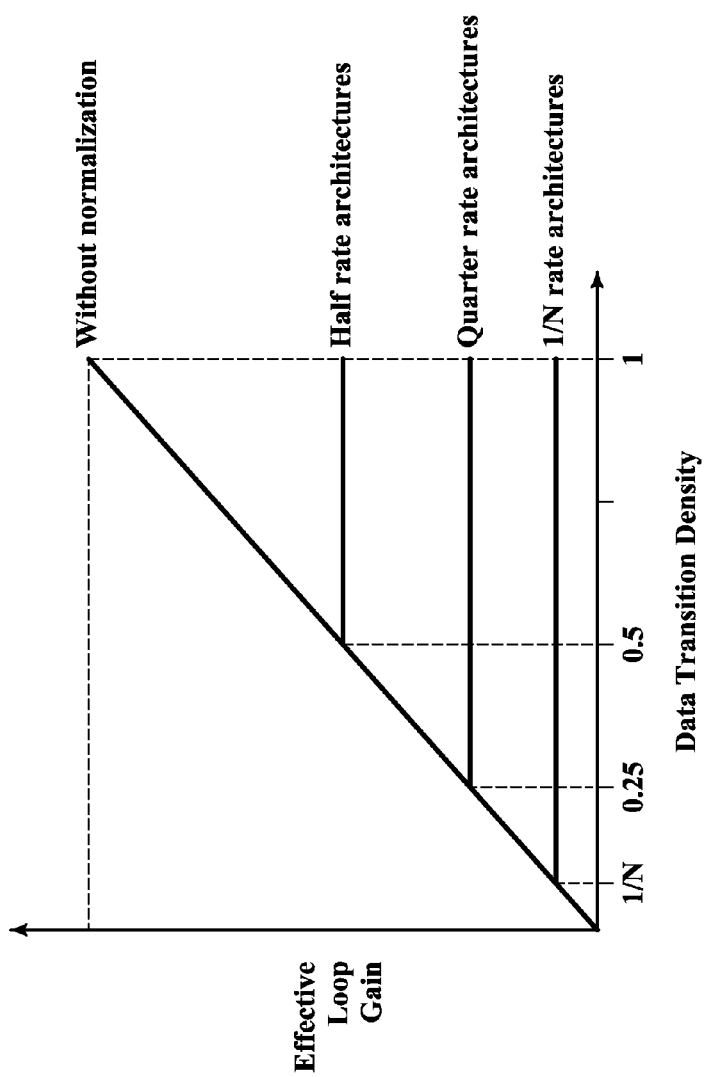
FIG. 10 is graph of effective loop gain for clock and data recovery circuits according to one embodiment.

While a half rate clock and data recovery circuit 32 has been described, the improvements in gain are further increased for quarter rate architectures and further increased for ⅛ rate architectures. This is shown in relation to FIG. 10 which is a graph of the effective loop gain of the clock and data recovery circuit with increasing data transition density. Without the logic to normalize the charge pump circuit 52 of FIG. 7, the effective open loop gain is very high. The half rate architecture as described in relation to FIGS. 8A and 8 has a gain which is much lower than the gain of the charge pump circuit 52 if the normalization circuitry was not included. For a quarter rate architecture, the effective loop gain further improves. For 1/N rate architecture, the effective loop gain continues to improve as N increases beyond 4 (corresponding to quarter rate architecture). Thus, the clock and data recovery circuit according to principles of the present disclosure is not only beneficial for a half rate architecture, but for quarter rate architectures and beyond.

While particular architectures and timing schemes have been disclosed above, those of skill in the art will understand that many other architectures and timing schemes are possible in light of the principles of the present disclosure. All such other embodiments fall within the scope of the present disclosure.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a data input configured to receive input data signal from an electronic device;
   a voltage controlled oscillator configured to generate first, second, third, and fourth clock signals mutually out of phase with each other;
   a phase detector circuit configured to receive the input data signal and the first, second, third, and fourth clock signals and to generate a first phase difference signal and a second phase difference signal based at least in part on the data signals and one or more of the clock signals, the second phase difference signal configured to transition to a high value if a transition in the input data signal is detected while the first phase difference signal is high; and
   a charge pump circuit coupled to the phase detector circuit, including:
      an OR gate configured to receive as input signals the first and the second phase difference signals and to pass a first current when the first and/or second phase difference signals are at the high value; and
      an output coupled to the voltage controlled oscillator, the output configured to provide an output signal to the voltage controlled oscillator based at least in part on the first current, the voltage controlled oscillator configured to adjust a frequency of the clock signals based on the output signal.

2. The device of claim 1 wherein the phase detector circuit is configured to generate a third phase difference signal and a fourth phase difference signal.

3. The device of claim 2 wherein the charge pump circuit comprises a second OR gate configured to receive as input signals the third and the fourth phase difference signals and to pass a second current when the third and/or fourth phase difference signals are at a high value.

4. The device of claim 1, further comprising a data output configured to supply a data output signal based on the data input signal.

5. The device of claim 1 wherein the first clock signal is substantially in phase with a clock signal of the electronic device.

6. The device of claim 1 wherein the first phase difference signal has a minimum pulse width of two cycles of the first clock signal.

7. The device of claim 1 wherein the output signal is the first current.

8. The device of claim 1 wherein the second clock signal is 90° out of phase with the first clock signal, the third clock signal is 90° out of phase with the second clock signal, the fourth clock signal is 90° out of phase with the third clock signal, and the first clock signal is 90° out of phase with the fourth clock signal.

9. The device of claim 8 wherein the first phase difference signal is in phase with the first clock signal.

10. The device of claim 9 wherein the second phase difference signal is in phase with the third clock signal.

11. The device of claim 1 wherein the phase detector circuit includes four flip-flop circuits, each receiving the data signal and a respective one of the first, second, third, and fourth clock signals.

12. A method, comprising:
   receiving an input data signal from an electronic device;
   supplying the input data signal to a phase detector circuit;
   generating in a voltage controlled oscillator first, second, third, and fourth clock signals out of phase with each other;
   supplying the first, second, third, and fourth clock signals to the phase detector circuit;
   generating a first phase difference signal in the phase detector circuit based at least in part on the data signal and one of the first, second, third, or fourth clock signals;
   generating a second phase difference signal in the phase detector circuit based at least in part on the data signal and one of the first, second, third, or fourth clock signals;
   supplying the first and second phase difference signals to respective input terminals of an OR gate; and
   passing a first current from the OR gate of a charge pump circuit if the first and/or second phase difference signal is high.

13. The method of claim 12, further comprising passing an output signal from the charge pump circuit to the voltage controlled oscillator, the output signal being based at least in part on the first current.

14. The method of claim 13, further comprising adjusting a frequency of the voltage controlled oscillator based on the output signal.

15. The method of claim 14 wherein the output signal is the first current.

16. The method of claim 12, further comprising locking the first clock signal in phase with an external clock signal generated in the electronic device.

17. The method of claim 12 wherein the second clock signal is 90° out of phase with the first clock signal, the third clock signal is 90° out of phase with the second clock signal, the fourth clock signal is 90° out of phase with the third clock signal, and the first clock signal is 90° out of phase with the fourth clock signal.

18. The method of claim 12, further comprising generating the first phase difference signal in phase with the first clock signal.

19. The method of claim 18, further comprising generating the second phase difference signal in phase with the third clock signal.

20. A device, comprising:
   a charge pump circuit, comprising:
      an OR gate having first and second inputs configured to receive a first and second UP phase difference signal respectively, the OR gate configured to pass a first current if the first and/or second UP phase difference signal has a high value; and
      an output configured to supply an output signal based in part on the first current; and
   a voltage controlled oscillator configured to adjust a frequency of a clock signal based in part on the output signal.

21. The device of claim 20, further comprising a phase detector circuit configured to receive an input data signal from an electronic device, to receive the clock signal from the voltage controlled oscillator, and to generate the first and second UP phase difference signals based at least in part on the data signal and the clock signal.

* * * * *